United States Patent
Wilshire

(10) Patent No.: US 11,239,845 B1
(45) Date of Patent: Feb. 1, 2022

(54) BIPHASE MARK CODE EDGE RECOVERY

(71) Applicant: AyDeeKay LLC, Aliso Viejo, CA (US)

(72) Inventor: Jim Wilshire, Aliso Viejo, CA (US)

(73) Assignee: AyDeeKay LLC, Aliso Viejo, CA (US)

( * ) Notice: Subject to any disclaimer, the term of this patent is extended or adjusted under 35 U.S.C. 154(b) by 0 days.

(21) Appl. No.: 17/322,880

(22) Filed: May 17, 2021

Related U.S. Application Data

(60) Provisional application No. 63/094,320, filed on Oct. 20, 2020.

(51) Int. Cl.
*H03L 7/08* (2006.01)

(52) U.S. Cl.
CPC .................... *H03L 7/0807* (2013.01)

(58) Field of Classification Search
CPC ..................................................... H03L 7/0807
See application file for complete search history.

(56) References Cited

U.S. PATENT DOCUMENTS

| | | | | |
|---|---|---|---|---|
| 9,337,993 | B1 * | 5/2016 | Lugthart | H04L 7/0054 |
| 10,027,332 | B1 * | 7/2018 | Wang | H04L 7/0331 |
| 10,797,658 | B1 * | 10/2020 | Raj | H03F 1/342 |
| 2007/0170256 | A1 * | 7/2007 | Breitfuss | H04L 25/4904 235/451 |
| 2010/0085163 | A1 * | 4/2010 | Mutti | H03M 13/41 340/10.5 |
| 2011/0200085 | A1 * | 8/2011 | Dally | H04L 25/03025 375/224 |
| 2016/0301426 | A1 * | 10/2016 | Ahmed | H03M 7/04 |
| 2019/0004987 | A1 * | 1/2019 | Henson | G06F 13/24 |
| 2019/0215250 | A1 * | 7/2019 | Bader | H04L 41/5009 |
| 2019/0393734 | A1 * | 12/2019 | Zhou | H02J 50/80 |
| 2020/0052872 | A1 * | 2/2020 | Ran | H04L 7/10 |
| 2020/0084015 | A1 * | 3/2020 | Manian | H03L 7/087 |
| 2021/0218544 | A1 * | 7/2021 | Choy | H04L 7/0008 |

* cited by examiner

*Primary Examiner* — Adam D Houston
(74) *Attorney, Agent, or Firm* — Steven Stupp

(57) ABSTRACT

An integrated circuit is described. This integrated circuit may include an input connector, coupled to a signal line, that conveys an input signal corresponding to encoded data, where the encoded data is encoded using a BMC, and the input signal may have different rise times and fall times. Moreover, the integrated circuit may include a recovery circuit, coupled to the input connector, that outputs the data based at least in part on a first threshold and a second threshold, where the output data may include data values with equal half-bit periods and variable frequency. Note that the recovery circuit may implement a state machine corresponding to the data.

20 Claims, 9 Drawing Sheets

BIPHASE MARK CODE EDGE RECOVERY

CROSS REFERENCE TO RELATED APPLICATIONS

This application claims priority under 35 U.S.C. 119(e) to U.S. Provisional Application Ser. No. 63/094,320, entitled "Biphase Mark Code Edge Recovery," by Jim Wilshire, filed on Oct. 20, 2020, the contents of both of which are herein incorporated by reference.

FIELD

The present disclosure relates to techniques for decoding signals that carry clock and data information. Notably, the present disclosure related to techniques for decoding signals using a biphase mark code (BMC) as part of the Universal Serial Bus (USB) power delivery standard.

BACKGROUND

The USB power delivery standard is part of the USB standard. This power delivery standard defines a power-supply interface via a USB cable. Notably, the USB power delivery standard allows a source and a sink end of a power supply to negotiate power-supply information and activity using a communication protocol based on a BMC technique.

The BMC technique is an information transmission technique that is widely used, e.g., in the transmission of audio signals. BMC is a type of encoding for binary data streams in which data and clock signals are combined to form a single two-level self-synchronizing data stream. It was developed to address the known difficulty in traditional digital signals. Notably, the use of BMC enables clock and data recovery by ensuring that there is at least one transition on the channel for each unit interval. In addition, BMC-coded signals have a zero average DC-offset voltage, because the signal is high and low for equal amounts of time.

USB is the current standard charging format for many handheld electronic devices. There are three standard sizes of USB connectors: standard for desktops or portable equipment; mini for mobile equipment; and micro for smart devices and tablets. In addition to charging electronic devices, USB is also capable of five speeds of data transfer: low, full, high, superspeed, and superspeed+. Unlike data buses such as Ethernet, USB has direct connections, which means that a host electronic device has downstream facing ports that connect to the upstream ports of electronic devices.

Moreover, note that USB is a single-ended communication system that can also deliver up to 100 Watts of power. Consequently, the definition of what is ground on one side of a USB cable or the other is highly variable, because of the voltage drop of the USB cable.

Furthermore, there is also no guarantee that the current in a USB cable does not suddenly change. For example, the current can suddenly change even when communication is occurring. This requires a long rise and fall time on data transitions in order to eliminate the chance of radiation. Consequently, duty cycles may change for some or all of the bits. While there is margin support in the USB specification if the duty cycles change too much, it is very low.

Additionally, in order to satisfy the need to exchange information when negotiating power contracts between electronic devices, existing USB standards have added a second data communication pair inside a USB cable. Unfortunately, adding signal lines into the USB cable has resulted in a problematic communication standard that is often barely able to get data from one end to the other at acceptable data rates. For example, the line quality is typically poor because of reflections, impedance mismatch, random effects, etc. Moreover, the transmitters and the cables are usually poorly controlled, which may severely impact the quality of the incoming signals. Furthermore, the specification is written in a way that allows communicators to be incoherent on their time base, which results in time-base uncertainty.

Wide-spread adoption of USB for charging and communication has resulted in a large number of vendors entering the market. However, the electronic devices provided by some of the vendors are poorly designed, which can compound signal-quality issues. Moreover, many of these electronic devices include poorly controlled connectors for USB cables from third-party sources, which further impacts the incoming-signal quality.

Compounding the aforementioned challenges, BMC data with disparate rising and falling edge rates can cause edge-detection results to be asymmetrical, which may make differentiating between the unit intervals representing 1s and between the unit intervals representing 0s more difficult to determine with a single midcell-to-end-of-cell threshold.

SUMMARY

Embodiments of an integrated circuit are described. This integrated circuit includes an input connector, coupled to a signal line, that conveys an input signal corresponding to encoded data, where the encoded data is encoded using a BMC, and the input signal may have different rise times and fall times. Moreover, the integrated circuit includes a recovery circuit, coupled to the input connector, that outputs the data based at least in part on a first threshold and a second threshold, where the output data may include data values with equal half-bit periods and variable frequency.

Furthermore, the integrated circuit may include: an edge circuit, coupled to the input connector, that detects edges and edge temporal locations in the input signal corresponding to a predefined preamble sequence in the encoded data; a time-interval circuit, coupled to the edge circuit, that identifies unit time intervals in a set of predefined types of unit time intervals in the encoded data based at least in part on the detected edges and the edge temporal locations; and a threshold circuit, coupled to the edge circuit, that selects the first threshold and the second threshold based at least in part on the identified unit time intervals.

Note that the identified unit time intervals may include a reference unit time interval with a longest unit time interval relative to remaining identified unit time intervals and that does not include an edge during the reference unit time interval. Additionally, the identified unit time intervals may include a first subset of unit time intervals corresponding to a first type of encoded data value and a second subset of unit time intervals corresponding to a second type of encoded data value. In some embodiments, the first type of encoded data value includes a zero and the second type of encoded data value includes a one.

Moreover, the recovery circuit may include a first-in first-out (FIFO) buffer.

Furthermore, the recovery circuit may implement a state machine corresponding to the data.

Additionally, the first threshold may include a rising-edge threshold and the second threshold may include a falling-edge threshold.

In some embodiments, the integrated circuit may include a clock data recovery (CDR), coupled to the recovery circuit, that recovers a clock based at least in part on the data.

Another embodiment provides an electronic device that includes the integrated circuit.

Another embodiment provides a system that includes the integrated circuit.

Another embodiment provides a method for outputting data. This method includes at least some of the operations performed by the integrated circuit.

This Summary is provided for purposes of illustrating some exemplary embodiments, so as to provide a basic understanding of some aspects of the subject matter described herein. Accordingly, it will be appreciated that the above-described features are examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF DRAWINGS

Note that like reference numerals refer to corresponding parts throughout the drawings. Moreover, multiple instances of the same part are designated by a common prefix separated from an instance number by a dash.

DETAILED DESCRIPTION

An integrated circuit is described. This integrated circuit may include an input connector, coupled to a signal line, that conveys an input signal corresponding to encoded data, where the encoded data is encoded using a BMC, and the input signal may have different rise times and fall times. Moreover, the integrated circuit may include a recovery circuit, coupled to the input connector, that outputs the data based at least in part on a first threshold and a second threshold, where the output data may include data values with equal half-bit periods and variable frequency. Note that the recovery circuit may implement a state machine corresponding to the data.

By receiving and decoding the data, these circuit techniques may address problems with USB power delivery. Notably, the circuit techniques may enable the negotiation of power-supply information and activity between a source and a sink using a BMC technique. Moreover, the circuit techniques may enable communication of the data at high data rates or speeds, poor line quality, poor signal quality, and/or time-base uncertainty. Furthermore, the circuit techniques may enable communication of the data in the presence of: variation in ground of a given side of a USB cable, variation of a duty cycle, and/or different rising and falling edge rates. Consequently, the circuit techniques may improve the performance of communication via a USB cable and USB power delivery. One or more of these capabilities may allow the embodiments of the integrated circuit or a receive circuit (such as a BMC processing circuit or a USB power-delivery controller) to be used in a wide variety of systems, electronic devices and applications.

Note that, from a communication theory perspective, there are two types of receivers. One approach uses edge detection (e.g., an incoherent edge-detection receive technique). However, most standards do not use edge detection. Instead, they use a wide variety of other techniques. The existing USB standards do not use edges to detect data.

Figure 1:
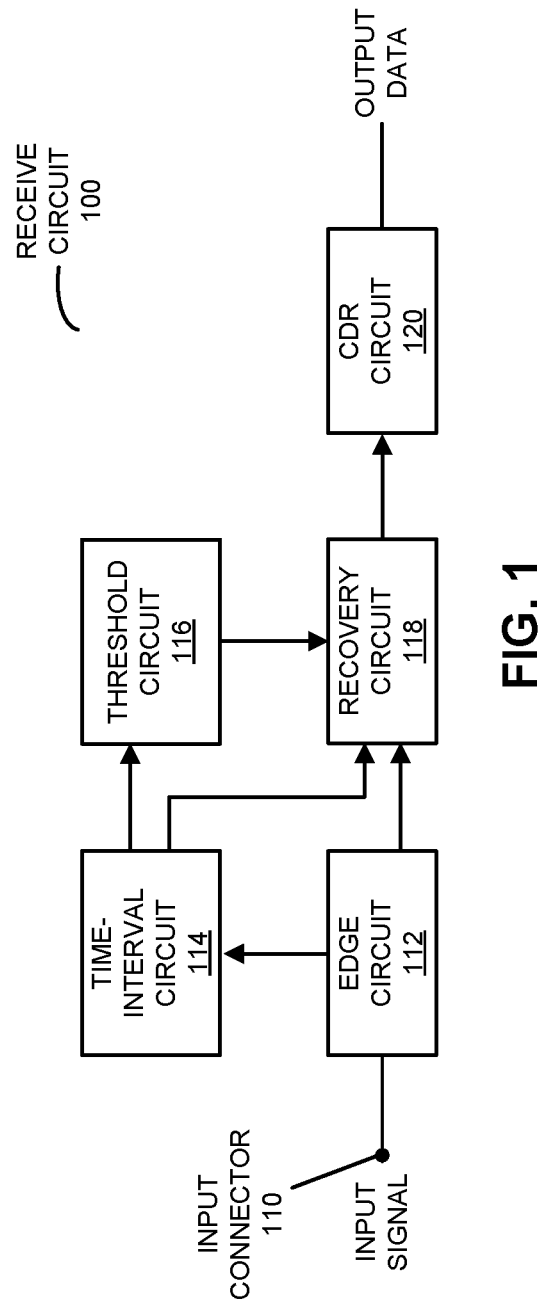
FIG. 1 is a drawing illustrating a block diagram of a receive circuit according to some embodiments of the present disclosure.

We now describe embodiments of the circuit techniques and a receive circuit. In the disclosed circuit techniques, the receive circuit may receive and decode input signals that include data that is encoded using a BMC code. This is shown in FIG. 1, which presents a drawing illustrating a block diagram of a receive circuit 100 according to some embodiments of the present disclosure. This receive circuit may include an input connector 110 that can couple to a signal line that conveys an input signal corresponding to encoded data, where the encoded data is encoded using a BMC. For example, the signal line may be included in a USB cable and the data may be associated with a USB power delivery standard. Moreover, receive circuit 100 may include an edge circuit 112, coupled to input connector 110, that detects edges and edge temporal locations in the input signal corresponding to a predefined preamble sequence in the encoded data. Furthermore, receive circuit 100 may include: a time-interval circuit 114, coupled to edge circuit 112, that identifies unit time intervals in a set of predefined types of unit time intervals in the encoded data based at least in part on the detected edges and the edge temporal locations; and a threshold circuit 116, coupled to edge circuit 112, that selects a first threshold and a second threshold based at least in part on the identified unit time intervals. Additionally, receive circuit 100 may include a recovery circuit 118, coupled to edge circuit 112, time-interval-circuit 114 and threshold circuit 116, that outputs the data based at least in part on the first threshold and the second threshold.

Notably, because of the known-repeatable characteristic of a preamble sequence, as well as the predictive characteristic of a BMC pattern or sequence outside the preamble, it is possible to determine whether a unit interval is a 1 or a 0 based on a threshold that compares like edges (both rising or both falling). This is accomplished by capturing an elapsed time value for each section of the BMC sequence during the preamble (e.g., '10101010') and identifying the largest value captured as the 'big 0.' The location and polarity of the big 0 in the captured values allows the times of all of the other elements of the sequence to be identified based on their positions relative to the big 0. In the circuit techniques, these appropriate sections of the preamble may be used to define rising-edge and falling-edge thresholds. Note that: at the end of a current unit interval, there are only two possible unit interval types that can follow; and the next edge will always be in the same direction regardless of whether the next unit interval is a 1 or a 0. The thresholds combined with these facts may allow the next unit interval bit value to be determined based at least in part on whether the next edge arrives before or after the threshold that is placed evenly between a midcell edge and an end-of-cell edge. Thus, the disparity between rise and fall times may be eliminated and a more robust capture of the received pattern may be accomplished.

These communication techniques may provide identification and capture of the incoming BMC unit interval sequence as states that drive a state machine. These captured states may be fed into a first-in first-out (fifo) that provides a circuit element to output these captured states as a recovered BMC with equal half-bit periods and a frequency that is variable based at least in part on a number of entries currently in the fifo. Consequently, the input BMC with variations in the edge detection with constant frequency may now be reproduced with an output that has a constant edge that is easier to detect and with variable frequency. This may allow recovery of the data from the encoded BMC by a state machine that is varying in frequency along with the pattern generated at the output of the fifo.

We now describe BMC signal regeneration and a finite difference injected disparity. In order to better understand the problem, the BMC signal from the configuration channel (CC) lines may be regenerated as follows. The analog front end of receive circuit 100 may have a ladder of, e.g., 10 comparators that are used to detect the amplitude of the BMC signal as it is being received. This comparator output may be fed to finite difference (FD) logic that compares a delayed sample of the comparators to the current sample of the comparators. If a large enough difference is seen between the samples, the FD logic may declare an edge and the BMC signal may be recreated with some level of edge filtering. However, disparate edge rates on the received BMC may have an effect on this edge detection, particularly if rise and fall times are significantly disproportionate. This is because the distance between sampled edges sometimes resulting in a slow edge followed by a fast edge (or vice versa) can cause the detected edges to be closer together or farther apart. Moreover, this effect may make it difficult to determine whether the next unit interval in the BMC pattern or sequence is a '1' or a '0' as the disparate edges may make recovery more difficult with a single threshold to discern a '1' from a '0.'

Figure 2:
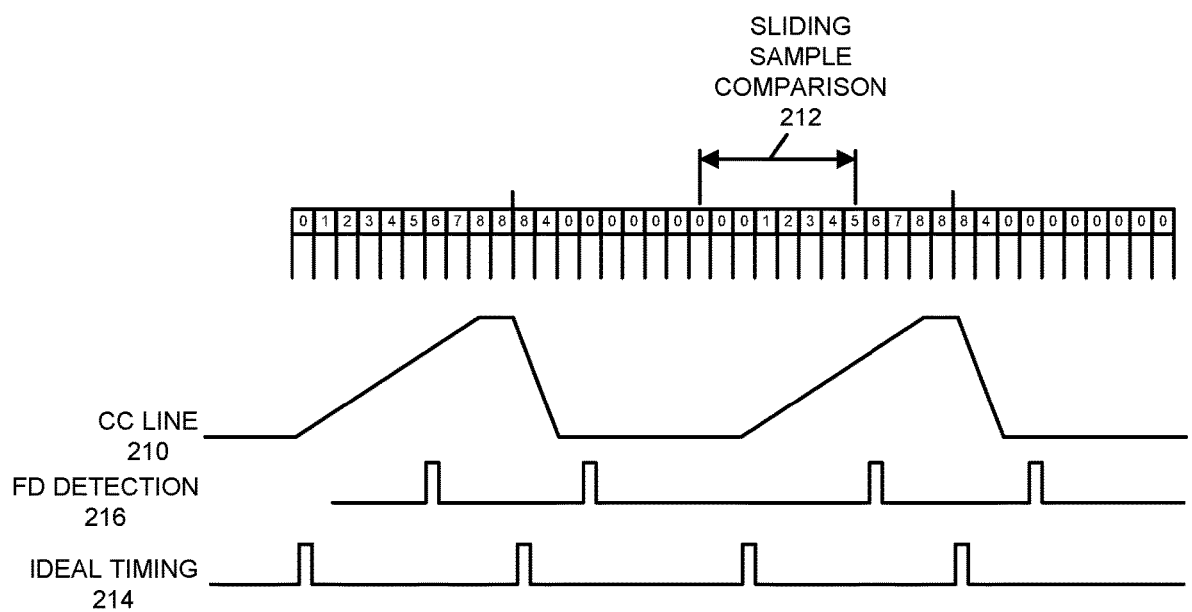
FIG. 2 is a drawing illustrating an example of biphase mark code (BMC) signal regeneration according to some embodiments of the present disclosure.

The FD injected disparity is shown in FIG. 2, which presents a drawing illustrating an example of BMC signal regeneration according to some embodiments of the present disclosure. Notably, a signal on a CC line 210 may be converted to comparator values as illustrated by the numbers in the boxes that indicate the value of the comparator output as the input signal is monitored. Moreover, the FD logic may set a sliding sample comparison 212 distance of, e.g., seven to provide the best noise filtering on the signal edges. In this example, the threshold is five, which means that there must be a finite difference of five between the two sample points in order to declare an edge. As shown in FIG. 2, if the rising edge (in this example) is slow and the falling edge is fast, the edge detection may cause the rising edge detection to take longer than the falling edge detection, which will have the effect of pushing edges closer together or pulling them farther apart depending on edge rate. It can be seen that, as the sliding sample comparisons take place, the threshold is reached more slowly on the rising edge and more quickly on the falling edge. This causes a disparity of edge detection relative to the boundaries of an ideal unit interval (which is the time to transfer one BMC bit over CC line 210) in which the edge detection would be more evenly spaced. The disparate positions of the rising and falling midcell edges make the detection of 1s versus 0s more difficult because of the reduced margin when both edges are used with the same detection threshold.

Note that ideal timing 214 illustrates the detection timing for an ideal signal that is not distorted. Moreover, FD detection 216 demonstrates the change in edge timing. Notably, the rising edge will be farther than (or delayed relative to) the ideal, while the falling edge will be closer to (or sooner relative to) the ideal.

Figure 3:
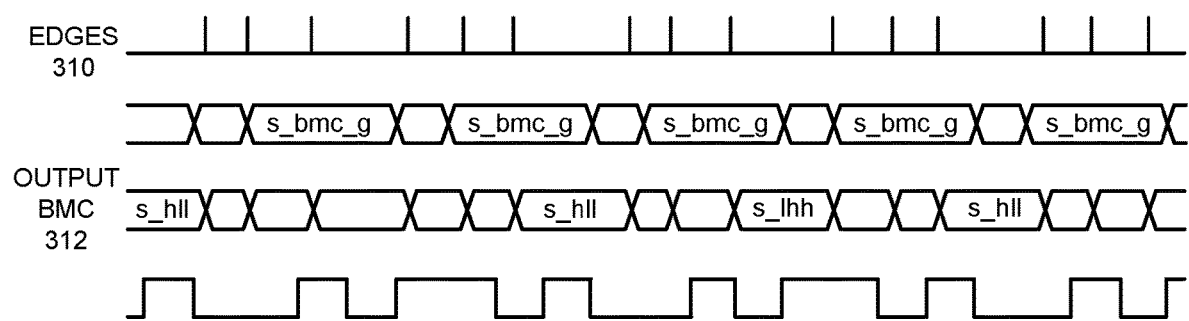
FIG. 3 is a drawing illustrating an example of a BMC signal simulation trace according to some embodiments of the present disclosure.

FIG. 3 presents a drawing illustrating an example of a BMC signal simulation trace according to some embodiments of the present disclosure. In FIG. 3, pulses or edges 310 into the 'fix the BMC' logic may be disparate and an output BMC 312 may have a variable frequency with well-centered midcell transitions. Moreover, in FIG. 3, ideally edges 310 should be equal distanced, but they are not.

We now describe embodiments of circuit techniques for capturing the BMC from the FD logic or detector at the frequency of the received BMC using a dual threshold that enables more robust capture of the BMC sequence. Moreover, embodiments of the circuit techniques may use a fifo to capture the received BMC states and to output a new BMC pattern or sequence that varies in frequency in order to keep the fifo from overflows and underflows by removing states faster or slower depending on the fifo level. In addition, the output states may be used to recreate a recovered BMC pattern or sequence with variable frequency unit intervals, but with well-centered midcell transitions that can be more easily recovered with a single threshold.

Note that the disclosed receive circuit may include multiple functions, including: the FD logic; the 'fixing of the BMC' logic, which takes the BMC with disparate edges and outputs variable frequency BMC with centered midcell transitions; and the receiving of the variable frequency BMC by tracking the frequency of the input stream and centering the single threshold equally between the midcell transitions (which are now equal for both rise information and fall information) making it easier to recover with the single-threshold value. In some embodiments, the fixing of the BMC logic and the receiving of the variable frequency BMC may be combined and the receive circuit may not need to convert the data back to BMC.

Figure 4:
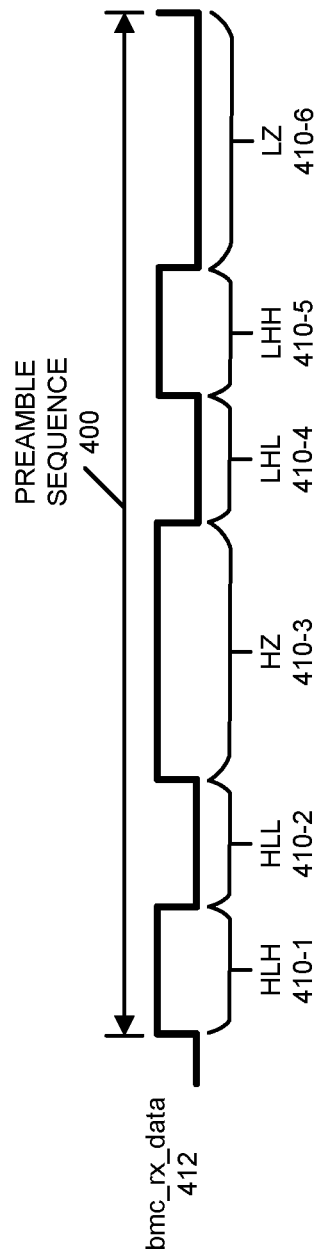
FIG. 4 is a drawing illustrating an example of a BMC preamble sequence according to some embodiments of the present disclosure.

FIG. 4 presents a drawing illustrating an example of a BMC preamble sequence 400 according to some embodiments of the present disclosure. Notably, bmc_rx_data 412 of a BMC pattern may be include in BMC preamble sequence 400 or section with a stream of alternating 1s and 0s. Moreover, BMC preamble sequence 400 may include one of the six possible time values 410. This may result in a pattern of edges that repeats after six edge transitions. Note that the six values may be captured to define the widths of the six time intervals 410 that exist during BMC preamble pattern 400, which may precede header and data fields in a message that is currently being received.

As noted previously, as these six values are captured, the largest value captured may be defined as the big 0. The big 0 location and polarity may define the positions of the values that have been captured. Table 1 presents an example of the values in the BMC preamble sequence.

TABLE 1

| Sequence Level | Description |
| --- | --- |
| Low High Low (LHL) 410-4 | Low level of a '1' unit interval (UI) with a low-to-high midcell transition |
| Low High High (LHH) 410-5 | High level of a '1' UI with a low-to-high midcell transition |
| Low Zero (LZ) 410-6 | Low level that is maintained for full '0' UI |
| High Low High (HLH) 410-1 | High level of a '1' UI with a high-to-low midcell transition |
| High Low Low (HLL) 410-2 | Low level of a '1' UI with a high-to-low midcell transition |
| High Zero (HZ) 410-3 | High level that is maintained for full '0' UI |

Figure 5:
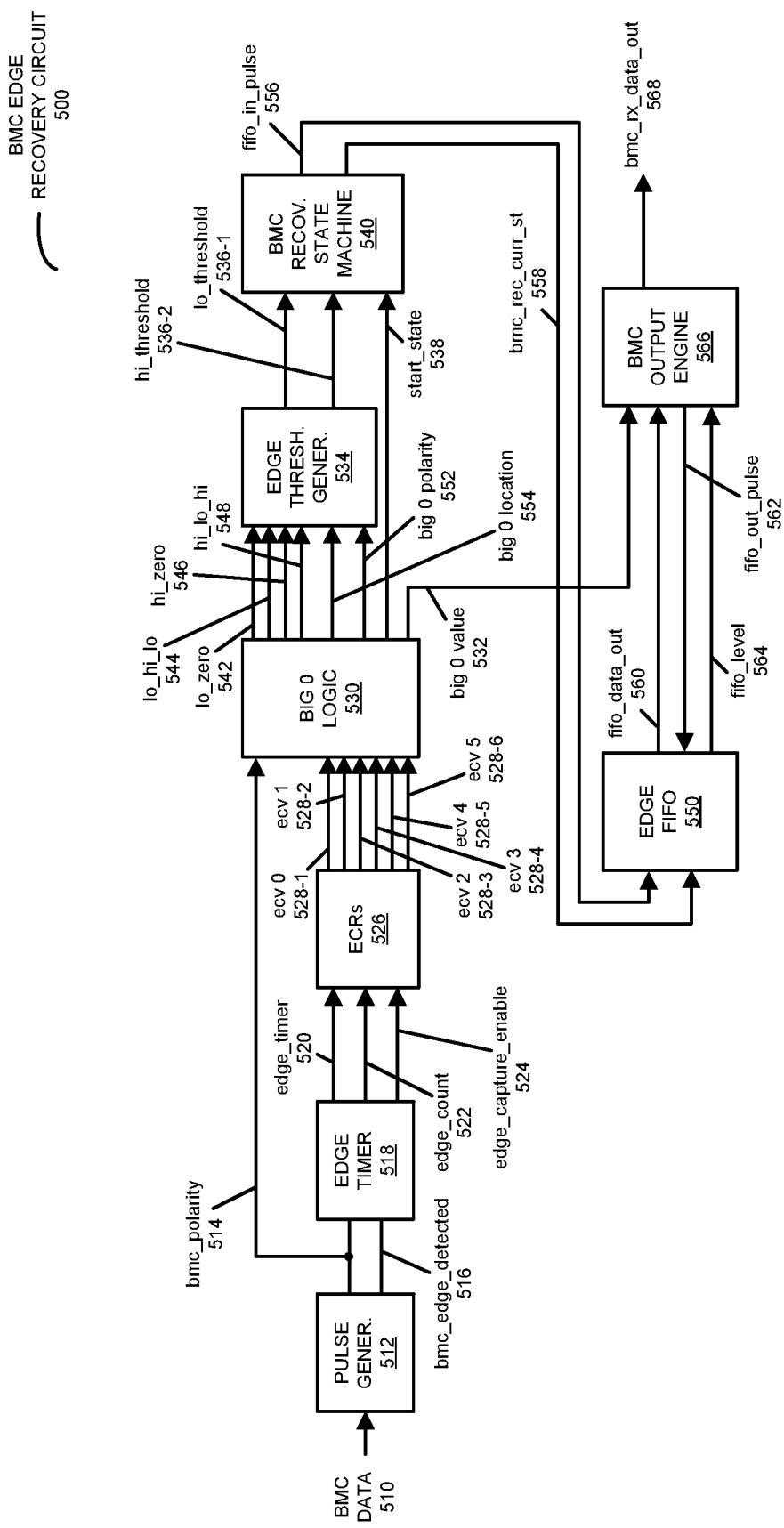
FIG. 5 is a drawing illustrating an example of a BMC edge recovery circuit according to some embodiments of the present disclosure.

The data in the BMC pattern or sequence may be recovered using a BMC recovery state machine. In this BMC recovery state machine, every state may have either an unconditional transition or a transition to one of two states depending on the position of the next edge relative to the low threshold or the high threshold. FIG. 5 presents a drawing illustrating an example of a BMC edge recovery circuit 500 in receive circuit 100 (FIG. 1) according to some embodiments of the present disclosure.

In FIG. 5, there are the following sequence of events. The states may be aligned with the current section of the received edges being generated from an incoming BMC serial stream of BMC data 510. When BMC edges from the FD logic begin to occur on the interface, a pulse generator 512 may generate a single-cycle pulse (a system clock) at every edge that is defined as a bmc_edge_detected signal 516. Every time we capture an edge, a bmc_polarity 514 may also be captured.

When the pulse-generator bmc_edge_detected signal 516 begins to generate pulses indicating that a BMC edge has occurred, one or more edge timers (such as edge timer 518) may count the number of system clocks that transpire between edges. At each bmc_edge_detected 516, an edge_timer 520 value may be captured and edge timer 518 may be simultaneously reset to start the count to the next edge. Moreover, an edge_count 522 may define the location, counting edges (e.g., one of the sequence of six edges into six registers) while an edge_capture_enable 524 may enable the capture based on the edge count. Furthermore, edge counter 518 may increment at every edge and may roll over at a count of or when it reaches five to frame the BMC preamble sequence and to create a window of time where six edge_count_values (ecv 0 to 5) 528 are captured in edge-count registers (ECRs) 526. Edge-count registers 526 may capture edge_timer 520 values for a sequence of six edges that define the various sequence states in the BMC preamble. While edge-count registers 526 are being captured, the value of each captured value may be compared against the previous value in order to determine if the current capture is a value that is greater than all of the previous values captured.

Edge_count_values 528 may be fed to big 0 logic 530, where they may be identified by their location relative to the location of a big 0 value 532. These values may be used by edge-threshold generator 534 to generate thresholds 536 used to differentiate 1s and 0s in the BMC stream. Moreover, start_state 538 may tell BMC recovery state machine 540 where to start. Notably, start_state 538 may determine where the preamble sequence is when BMC recovery state machine 540 starts.

This may be done to enable big 0 logic 530 to determine the greatest edge-to-edge time value and designate it as big 0 value 532. This can be determined because the largest edge time value may be guaranteed to be zero because of the absence of a midcell transition which occurs during a BMC 1. Moreover, big 0 logic 530 may determine the location of the big 0 in edge-count registers 526, its value, and its polarity. This may enable big 0 logic 530 to properly associate edge counts to levels in the preamble sequence. Big 0 value 532 may be used by the full bit-time calculation logic to start the BMC output timer at a count that is near the received BMC frequency. This value may also be fed to BMC decoding logic (not shown), so that it starts at the same BMC frequency as well. Note that lo_zero 542 and lo_hi_lo 544 values may be used to calculate lo_threshold 536-1 and hi_zero 546 and hi_lo_hi 548 values may be used to calculate hi_threshold 536-2. These thresholds may be used to identify the states that will be pushed into the edge fifo 550.

Once big 0 value 532 and its polarity 552 and location 554 in the edge-count registers 526 are determined, the other values of the preamble sequence may be determined based at least in part on their position in edge-count registers 526 relative to position 554 of big 0 value 532.

Furthermore, BMC recovery state machine 540 may identify the next state that should be pushed into the edge fifo 550 based at least in part on whether the next edge it sees is a midcell or end-of-cell transition. Fifo_in_pulse 556 may capture the current state of BMC recovery state machine 540, bmc_rec_curr_st 558, into edge fifo 550. Each transition of BMC recovery state machine 540 may be pushed into the edge fifo 550, where it will later be read by a BMC generation state machine. These states may define the order of the received BMC, which will be used to generate a retimed BMC stream from a fifo output, fifo_data_out 560. Additionally, fifo_out_pulse 562 may output the data of BMC recovery state machine 540, which comes out of a BMC output engine 566 when it needs the next state. Fifo level 564 threshold may be used to make sure that we do not have an underflow. Moreover, BMC output engine 566 may retrieve the outputs of the edge fifo 550 and may recreate the sequence of the BMC with clean timing intervals. bmc_rx_data_out 568 may be the data created by BMC output engine 566.

Note that edge timer 518 may increment when the edge counter rolls over the frames with one preamble sequence per count.

The BMC generation state machine may take the bit stream captured by BMC edge recovery circuit 500 and may output a retimed BMC stream (or pattern or sequence) that has equal half bit timing for '1' unit intervals, which may simplify the decoding of the BMC stream by a clock data recovery (CDR) circuit (such as CDR circuit 120 in FIG. 1). The frequency of the BMC generation may vary relative to the number of fifo entries that are present at any given time. The BMC decoding logic may also track this frequency, in order to reliably decode the 4b5b data from the BMC.

For example, if the big 0 value is in location 3 in edge_count_value 528-4 and its polarity is high, Table 2 presents an example of positions of all of the other sections of the BMC preamble sequence.

TABLE 2

| Edge_count_value 528 | Big 0 Location 554 | Sequence Level | Entry | Midcell | Exit |
| --- | --- | --- | --- | --- | --- |
| 0 | | LZ 410-6 | H-L | | L-H |
| 1 | | HLH 410-1 | L-H | H-L | |
| 2 | | HLL 410-2 | | H-L | L-H |
| 3 | Big 0 | HZ 410-3 | L-H | | H-L |

TABLE 2-continued

| Edge_count_value 528 | Big 0 Location 554 | Sequence Level | Entry | Midcell | Exit |
|---|---|---|---|---|---|
| 4 | | LHL 410-4 | H-L | L-H | |
| 5 | | LHH 410-5 | | L-H | H-L |

Moreover, Table 3 presents an example of possible transitions.

TABLE 3

| Current State | Next State 1 | Next State 2 |
|---|---|---|
| LZ 410-6 | HLH 410-1 | HZ 410-3 |
| HLH 410-1 | HLL 410-2 | |
| HLL 410-2 | HLH 410-1 | HZ 410-3 |
| HZ 410-3 | LHL 410-4 | LZ 410-6 |
| LHL 410-4 | LHH 410-5 | |
| LHH 410-5 | LHL 410-4 | LZ 410-6 |

It can be seen from Table 3 that there are two states (HLH 410-1 and LHL 410-4) that will unconditionally transition to a single state, so this transition is guaranteed to always occur. Moreover, the other states only have two possible transitions, and both of these transitions will result in the same edge polarity being seen, which means that a threshold can be generated to determine the difference between a subsequent '1' and a '0' can be determined by using the time values between like edges (both rising or both falling) associated with the BMC preamble sections. These thresholds can be used during the data fields that follow the preamble by knowing the current state of the BMC pattern and applying the appropriate rising-edge or falling-edge threshold to determine the next state.

Figure 6:
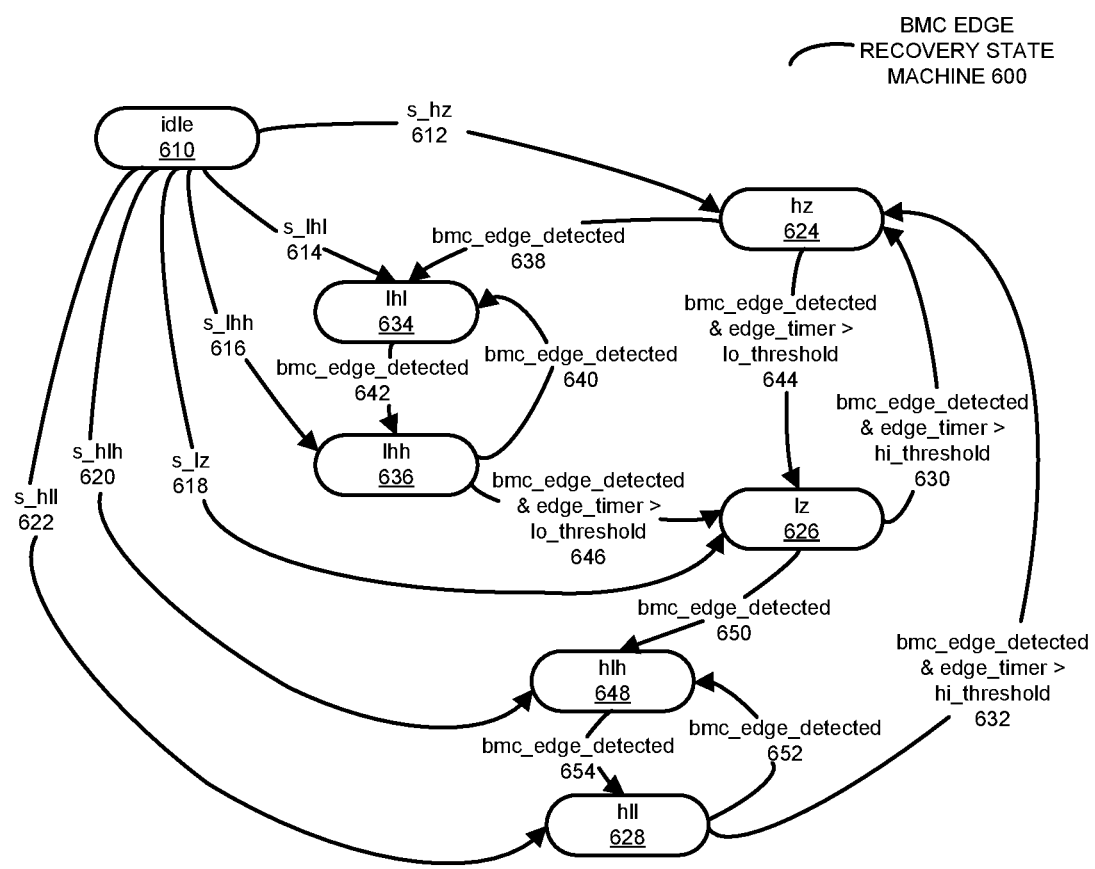
FIG. 6 is a drawing illustrating an example of a BMC edge recovery state machine according to some embodiments of the present disclosure.

FIG. 6 presents a drawing illustrating an example of a BMC edge recovery state machine 600 in receive circuit 100 (FIG. 1) according to some embodiments of the present disclosure. From an idle state 610, there are six possible new states: s_hz 612, s_lhl 614, s_lhh 616, s_lz 618, s_hlh 620 and s_hll 622. Each state may transition to the next state as illustrated in Table 2.

Note that idle state 610 may be entered at reset. When edges start to be received, the edge timer and edge counter may begin to count and when the edge count reaches five, the next edge may transition to one of start states 612-622, which is the state that BMC edge recovery state machine 600 expects the fifo to output, based at least in part on the sequence order determined by the big 0 logic. The transition to the next state is defined by one of start states 612-622, as shown in FIG. 6.

Moreover, hz state 624 may be entered from idle 610 when the start state is equal to s_hz 612. This state can also be entered from lz state 626 or hll state 628 when the edge timer is greater than the hi_threshold 630 or 632.

Furthermore, lhl state 634 may be entered from idle 610 when the start state is equal to s_lhl 614. This state can also be entered from the hz state 624 or lhh state 636 when the edge timer is below the lo_threshold value when the next edge is detected 638 or 640.

Additionally, lhh state 636 may be entered from idle 610 when the start state is equal to lhh 616. This state may also be entered unconditionally from lhl state 634 when the next edge is detected 642.

Note that lz state 626 may be entered from idle 610 when the start state is equal to s_lz 618. This state can also be entered from the hz state 624 or the lhh state 636 when the edge timer is greater than the lo_threshold 644 or 646.

Moreover, hlh state 648 may be entered from idle 610 when the start state is equal to s_hlh 620. This state can also be entered from the lz state 626 or hll state 628 when the edge timer is below the lo_threshold value when the next edge is detected 650 or 652.

Furthermore, hll state 628 is entered from idle 610 when the start state is equal to s_hll 622. This state may also be entered unconditionally from hlh state 648 when the next edge is detected 654.

We now describe threshold determination. When the capture of the BMC sequence is enabled, the edge-count registers may be loaded with the value from the edge timer, which is reset at every edge. Moreover, when the first value is captured to the edge_count_value 0 register and also becomes the big 0 value, its polarity and location in the edge_count_value registers may also be captured. Furthermore, when the next edge arrives, the edge-timer count may be loaded into the edge_count_value 1 register. If the new value is greater than the current big 0 value, this value may become the big 0 value and its polarity and location may replace the previous values. This occurs for each subsequent edge_count_value register until all six values are loaded.

At this point, the capture ends and the big 0 value, location and polarity are available. Because the edge_count_value register that contains the big 0 value is known as well as the polarity, the other values in the edge-count registers can now be identified as well, because the preamble pattern is known and repeatable. Consequently, thresholds may be set to discern whether the current unit interval being received is a '1' or a '0.' Threshold setting may be based at least in part on the halfway point between a midcell edge and the end-of-cell edge. In some embodiments, there may be different thresholds used for rising and falling edges, which may be determined by a calculation that places a threshold between the next midcell edge and the next end-of-cell edge.

Because of the characteristics of BMC encoding, both of these edges may be either rising or falling, so that the edge rate will be consistent. For example, if the current state is LZ, then there are only two possible transitions that can be immediately after the rising edge at the end of the LZ state. Either the next state will be HLH, which is the high time of a subsequent '1' unit interval, or HZ, which is the high time of a subsequent '0' unit interval. In this example, the threshold may be found by ((HZ−HLH)/2)+HLH.

Figure 7:
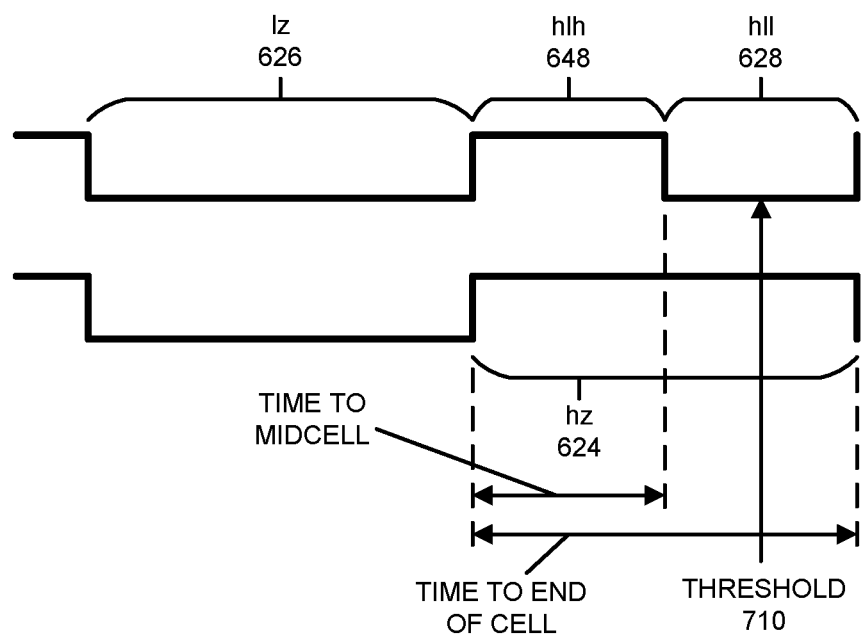
FIG. 7 is a drawing illustrating an example of a threshold according to some embodiments of the present disclosure.

FIG. 7 presents a drawing illustrating an example of a threshold according to some embodiments of the present disclosure. Notably, the current state of the BMC recovery state machine may be hz 624, so the only possible transitions that can occur will be lhl 634 and lz 626, which are both entered with a high-to-low transition. Which state is detected is determined by the next rising edge occurring either before or after a low threshold 710.

Low threshold 710 may be used to determine if the next bit is a '1' (LH part of LHL) or a '0' by subtracting the LHL edge_count_value from the LZ edge_count_value, dividing this by 2, and adding it to the LHL edge-count_value. This places low threshold 710 evenly between the next state low times, so that the next rising edge can be determined to be a '1' if it occurs before low threshold 710 and a '0' if the edge occurs after low threshold 710. This determination also defines the transition to the next state. Notably, if the edge is before the transition, the lhl state 634 is entered. If it is after low threshold 710, the lz state 626 is entered.

Note that the high threshold may be generated in the same way, except using the HZ 410-3 and HLH 410-1 time values.

Additionally, there may be a start state that is used by the BMC recovery state machine to align the first state transition of the section of the preamble that is present when the BMC recovery state machine begins at the end of the edge capture sequence, because there may be a random alignment of sections in the edge_count_value registers. The big 0 location in the preamble may determine the identity of all of the other values (edges) and, therefore, where the BMC recovery state machine starts the start state.

Figure 8:
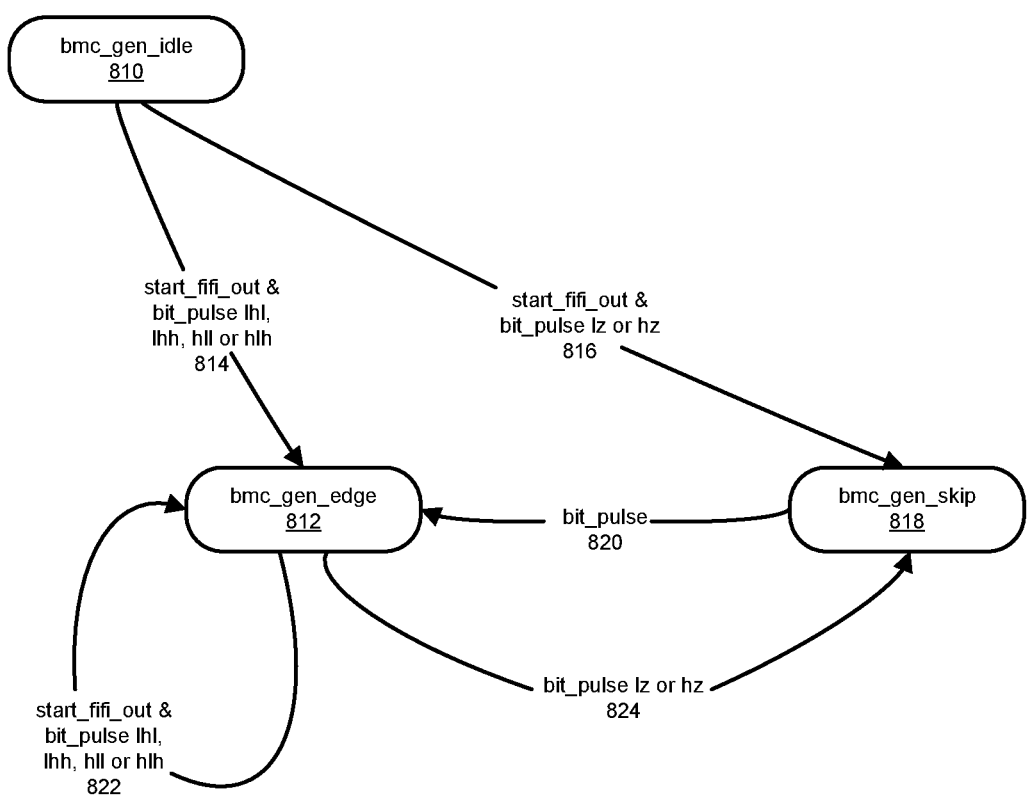
FIG. 8 is a drawing illustrating an example of BMC generation according to some embodiments of the present disclosure.

We now describe BMC generation. FIG. 8 presents a drawing illustrating an example of BMC generation in receive circuit 100 (FIG. 1) according to some embodiments of the present disclosure. Notably, the state transitions may be fed into the edge fifo. The edge fifo may store these transitions at a frequency of the received BMC edges and the output of the fifo may be controlled by a variable-frequency engine that tracks to a frequency required to ensure that there is no loss of information because of overflow or underflow in the edge fifo. As the output engine varies in frequency, it may also output the originally captured BMC transitions with the midcell transitions now centered in the unit interval. This may be accomplished via a small state machine that detects the current state from the edge fifo and that outputs an edge at the beginning of a unit interval or in the middle of a unit interval.

In FIG. 8, bmc_gen_idle state 810 may be entered at reset. On the full_bit_pulse or half_bit_pulse (bit_pulse) after start_fifo_out is set, the state machine may transition to bmc_gen_edge state 812 if the fifo output is lhl, lhh, hll, or hlh 814. Alternatively, if the fifo output is lz or hz 816, the state machine may transition to bmc_gen_skip state 818.

Moreover, bmc_gen_edge state 812 may be entered from bmc_gen_idle state 810 when the fifo starts and bit pulses begin while the fifo data is lhl, lhh, hlh, or hll 814. It can also be entered from bmc_gen_skip state 818 unconditionally on the next bit pulse 820 or it may return to itself if the fifo output is lhl, lhh, hlh, or hll 822. When this state is entered, an edge may be generated on the bmc_rx_data_out.

Furthermore, bmc_gen_skip state 818 may be entered from bmc_gen_idle state 810 when the fifo starts and bit pulses begin while the fifo data is lz or hz 816. This state may also be entered from bmc_gen_edge state 812 when the fifo_data_out is lz or hz 824. This state may allow the midcell transition to be skipped.

Figure 9:
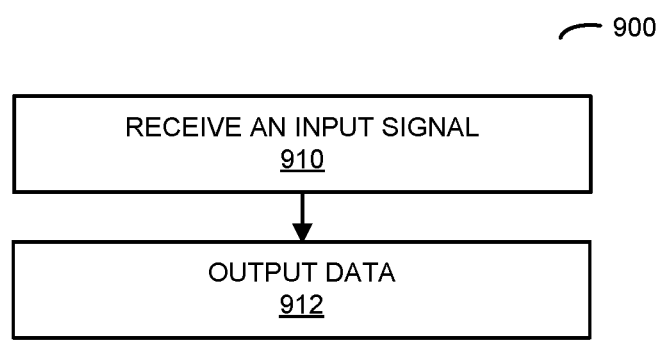
FIG. 9 is a flow diagram illustrating an example of a method for outputting data according to some embodiments of the present disclosure.

We now describe embodiments of a method. FIG. 9 presents a flow diagram illustrating an example of a method 900 for outputting data using a recovery circuit, such as recovery circuit 118 in receive circuit 100 (FIG. 1). During operation, the recovery circuit may receive, on a signal line, an input signal (operation 910) corresponding to encoded data, where the encoded data is encoded using a BMC, and where the input signal has different rise times and fall times. Moreover, the recovery circuit may output the data (operation 912) based at least in part on a first threshold and a second threshold, wherein the output data comprise data values with equal half-bit periods and variable frequency.

In some embodiments of the method 900, there may be additional or fewer operations. Moreover, the order of the operations may be changed, and/or two or more operations may be combined into a single operation.

The disclosed receive circuit and the circuit techniques can be (or can be included in) any electronic device. For example, the electronic device may include: a cellular telephone or a smartphone, a tablet computer, a laptop computer, a notebook computer, a personal or desktop computer, a netbook computer, a media player device, an electronic book device, a MiFi® device, a smartwatch, a wearable computing device, a portable computing device, a consumer-electronic device, an access point, a router, a switch, communication equipment, test equipment, a vehicle, a ship, an airplane, a car, a truck, a bus, a motorcycle, manufacturing equipment, farm equipment, construction equipment, or another type of electronic device.

Although specific components are used to describe the embodiments of the receive circuit and the integrated circuit that includes the receive circuit, in alternative embodiments different components and/or subsystems may be present in the receive circuit and/or the integrated circuit that includes the receive circuit. Thus, the embodiments of the receive circuit and/or the integrated circuit that includes the receive circuit may include fewer components, additional components, different components, two or more components may be combined into a single component, a single component may be separated into two or more components, one or more positions of one or more components may be changed, and/or there may be different types of components.

Moreover, the circuits and components in the embodiments of the receive circuit and/or the integrated circuit that includes the receive circuit may be implemented using any combination of analog and/or digital circuitry, including: bipolar, PMOS and/or NMOS gates or transistors. Furthermore, signals in these embodiments may include digital signals that have approximately discrete values and/or analog signals that have continuous values. Additionally, components and circuits may be single-ended or differential, and power supplies may be unipolar or bipolar. Note that electrical coupling or connections in the preceding embodiments may be direct or indirect. In the preceding embodiments, a single line corresponding to a route may indicate one or more single lines or routes.

As noted previously, an integrated circuit may implement some or all of the functionality of the circuit techniques. This integrated circuit may include hardware and/or software mechanisms that are used for implementing functionality associated with the circuit techniques.

In some embodiments, an output of a process for designing the integrated circuit, or a portion of the integrated circuit, which includes one or more of the circuits described herein may be a computer-readable medium such as, for example, a magnetic tape or an optical or magnetic disk. The computer-readable medium may be encoded with data structures or other information describing circuitry that may be physically instantiated as the integrated circuit or the portion of the integrated circuit. Although various formats may be used for such encoding, these data structures are commonly written in: Caltech Intermediate Format (CIF), Calma GDS II Stream Format (GDSII), Electronic Design Interchange Format (EDIF), OpenAccess (OA), or Open Artwork System Interchange Standard (OASIS). Those of skill in the art of integrated circuit design can develop such data structures from schematic diagrams of the type detailed above and the corresponding descriptions and encode the data structures on the computer-readable medium. Those of skill in the art of integrated circuit fabrication can use such encoded data to fabricate integrated circuits that include one or more of the circuits described herein.

While some of the operations in the preceding embodiments were implemented in hardware or software, in general the operations in the preceding embodiments can be implemented in a wide variety of configurations and architectures. Therefore, some or all of the operations in the preceding embodiments may be performed in hardware, in software or both. For example, at least some of the operations in the circuit techniques may be implemented using program instructions that are executed by a processor or in firmware in an integrated circuit.

Moreover, while examples of numerical values are provided in the preceding discussion, in other embodiments different numerical values are used. Consequently, the numerical values provided are not intended to be limiting.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An integrated circuit, comprising:
   an input connector configured to couple to a signal line that conveys an input signal corresponding to encoded data, wherein the encoded data is encoded using a biphase mark code (BMC), and wherein the input signal has different rise times and fall times; and
   a recovery circuit, coupled to the input connector, configured to output the data based at least in part on a first threshold and a second threshold, wherein the output data comprise data values with equal half-bit periods and variable frequency.

2. The integrated circuit of claim 1, wherein the integrated circuit comprises:
   an edge circuit, coupled to the input connector, configured to detect edges and edge temporal locations in the input signal corresponding to a predefined preamble sequence in the encoded data;
   a time-interval circuit, coupled to the edge circuit, configured to identify unit time intervals in a set of predefined types of unit time intervals in the encoded data based at least in part on the detected edges and the edge temporal locations; and
   a threshold circuit, coupled to the edge circuit, configured to select the first threshold and the second threshold based at least in part on the identified unit time intervals.

3. The integrated circuit of claim 2, wherein the identified unit time intervals comprise a reference unit time interval with a longest unit time interval relative to remaining identified unit time intervals and that does not comprise an edge during the reference unit time interval.

4. The integrated circuit of claim 2, wherein the identified unit time intervals comprise a first subset of unit time intervals corresponding to a first type of encoded data value and a second subset of unit time intervals corresponding to a second type of encoded data value.

5. The integrated circuit of claim 4, wherein the first type of encoded data value comprises a zero and the second type of encoded data value comprises a one.

6. The integrated circuit of claim 1, wherein the recovery circuit comprises a first-in first-out (FIFO) buffer.

7. The integrated circuit of claim 1, wherein the recovery circuit is configured to implement a state machine corresponding to the data.

8. The integrated circuit of claim 1, wherein the first threshold comprises a rising-edge threshold and the second threshold comprises a falling-edge threshold.

9. The integrated circuit of claim 1, wherein the integrated circuit further comprises a clock data recovery (CDR), coupled to the recovery circuit, configured to recover a clock based at least in part on the data.

10. A method for outputting data, comprising:
    by a recovery circuit:
    receiving, on a signal line, an input signal corresponding to encoded data, wherein the encoded data is encoded using a biphase mark code (BMC), and wherein the input signal has different rise times and fall times; and
    outputting the data based at least in part on a first threshold and a second threshold, wherein the output data comprise data values with equal half-bit periods and variable frequency.

11. An integrated circuit, comprising:
    an input connector configured to couple to a signal line that conveys an input signal corresponding to encoded data, wherein the encoded data is encoded using a biphase mark code (BMC);
    an edge circuit, coupled to the input connector, configured to detect edges and edge temporal locations in the input signal corresponding to a predefined preamble sequence in the encoded data;
    a time-interval circuit, coupled to the edge circuit, configured to identify unit time intervals in a set of predefined types of unit time intervals in the encoded data based at least in part on the detected edges and the edge temporal locations;
    a threshold circuit, coupled to the edge circuit, configured to select a first threshold and a second threshold based at least in part on the identified unit time intervals; and
    a recovery circuit, coupled to the edge circuit, the time-interval circuit and the threshold circuit, configured to output the data based at least in part on the first threshold and the second threshold.

12. The integrated circuit of claim 11, wherein the identified unit time intervals comprise a reference unit time interval with a longest unit time interval relative to remaining identified unit time intervals and that does not comprise an edge during the reference unit time interval.

13. The integrated circuit of claim 11, wherein the recovery circuit comprises a first-in first-out (FIFO) buffer.

14. The integrated circuit of claim 11, wherein the recovery circuit is configured to implement a state machine corresponding to the data.

15. The integrated circuit of claim 11, wherein the first threshold comprises a rising-edge threshold and the second threshold comprises a falling-edge threshold.

16. The integrated circuit of claim 11, wherein the identified unit time intervals comprise a first subset of unit time intervals corresponding to a first type of encoded data value and a second subset of unit time intervals corresponding to a second type of encoded data value.

17. The integrated circuit of claim 16, wherein the first type of encoded data value comprises a zero and the second type of encoded data value comprises a one.

18. The integrated circuit of claim 11, wherein the output data comprise data values with equal half-bit periods and variable frequency.

19. The integrated circuit of claim 11, wherein the input signal has different rise times and fall times.

20. The integrated circuit of claim 11, wherein the integrated circuit further comprises a clock data recovery (CDR), coupled to the recovery circuit, configured to recover a clock based at least in part on the data.

* * * * *